United States Patent
Jeon et al.

(10) Patent No.: US 9,686,874 B2
(45) Date of Patent: Jun. 20, 2017

(54) DISPLAY DEVICE

(71) Applicant: LG DISPLAY CO., LTD., Seoul (KR)

(72) Inventors: Yongjoon Jeon, Seoul (KR); SeokHyo Cho, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 5 days.

(21) Appl. No.: 14/971,486

(22) Filed: Dec. 16, 2015

(65) Prior Publication Data

US 2016/0381813 A1   Dec. 29, 2016

(30) Foreign Application Priority Data

Jun. 25, 2015 (KR) .................. 10-2015-0090151

(51) Int. Cl.
*H05K 5/00* (2006.01)
*H05K 5/02* (2006.01)
*H05K 5/03* (2006.01)

(52) U.S. Cl.
CPC ......... *H05K 5/0017* (2013.01); *H05K 5/0021* (2013.01); *H05K 5/0026* (2013.01); *H05K 5/0234* (2013.01); *H05K 5/0247* (2013.01); *H05K 5/03* (2013.01)

(58) Field of Classification Search
None
See application file for complete search history.

(56) References Cited

U.S. PATENT DOCUMENTS

| | | | | |
|---|---|---|---|---|
| 5,409,191 A | * | 4/1995 | Wenmaekers | E04B 9/006 248/317 |
| 5,779,346 A | * | 7/1998 | Burke | F21S 8/035 313/503 |
| 6,587,083 B1 | * | 7/2003 | Basturk | G02F 1/133536 345/4 |
| 7,864,524 B2 | * | 1/2011 | Ladouceur | G06F 1/1616 361/679.55 |
| 9,235,072 B1 | * | 1/2016 | Yang | G02B 6/0076 |
| 9,529,464 B2 | * | 12/2016 | Sitbon | F16M 11/08 |
| 2004/0051679 A1 | * | 3/2004 | Ponx | G06F 1/1616 345/1.1 |
| 2006/0187140 A1 | * | 8/2006 | Brask | G06F 1/1601 345/1.1 |
| 2007/0285413 A1 | * | 12/2007 | Wong | G06F 1/1601 345/211 |
| 2008/0024388 A1 | * | 1/2008 | Bruce | G06F 1/1616 345/1.1 |
| 2008/0062625 A1 | * | 3/2008 | Batio | G06F 1/1615 361/679.29 |
| 2009/0091512 A1 | * | 4/2009 | Jung | G06F 1/1601 345/1.1 |

(Continued)

*Primary Examiner* — Xanthia C Cunningham
(74) *Attorney, Agent, or Firm* — Dentons US LLP (57) ABSTRACT

Provided is a display device that includes a middle cabinet in which two display panels of which two rear sides are leaning on each other are safely held, and an incision is formed in at least a portion of a rim of the middle cabinet; a back cover is interposed between the two display panels and has an extension portion that is inserted through the incision and extends to an outside, and a fixing member in which control printed circuit boards that are coupled to the extension portion of the back cover and are connected to the two display panels respectively are embedded.

10 Claims, 10 Drawing Sheets

(56) References Cited

U.S. PATENT DOCUMENTS

| | | | |
|---|---|---|---|
| 2010/0142139 A1* | 6/2010 | Szabolcsi | G06F 1/1616 |
| | | | 361/679.27 |
| 2010/0202105 A1* | 8/2010 | Chang | G06F 1/1647 |
| | | | 361/679.27 |
| 2011/0038109 A1* | 2/2011 | Hwang | G06F 1/1601 |
| | | | 361/679.01 |
| 2012/0019434 A1* | 1/2012 | Kuhlman | G02F 1/13306 |
| | | | 345/1.3 |
| 2014/0035794 A1* | 2/2014 | Chen | G06F 3/1431 |
| | | | 345/1.3 |
| 2015/0181729 A1* | 6/2015 | Lewis | F16M 11/22 |
| | | | 312/138.1 |

* cited by examiner

*FIG.10*

DISPLAY DEVICE

CROSS REFERENCE TO RELATED APPLICATION

This application claims priority from and the benefit under 35 U.S.C. §119(a) of Korean Patent Application Number 10-2015-0090151 filed on Jun. 25, 2015, which is hereby incorporated by reference for all purposes as if fully set forth herein.

BACKGROUND OF THE INVENTION

Field of the Invention

The present invention relates to a display device. More particularly, the present invention relates to a display device, of which two rear sides are leaning on each other, of which two front sides can be seen, of which a decrease in thickness and weight can be achieved, and in which usability can be improved due to properties of free rotation.

Description of the Related Art

Generally, although a liquid crystal display device, a plasma display device, a field emission display device, a light emitting display device, and the like are actively studied as a flat type display device, the liquid crystal display device and the light emitting display device are in the spot light because advantages in mass production technology, convenience of driving means, and realization of high resolution.

Figure 1:
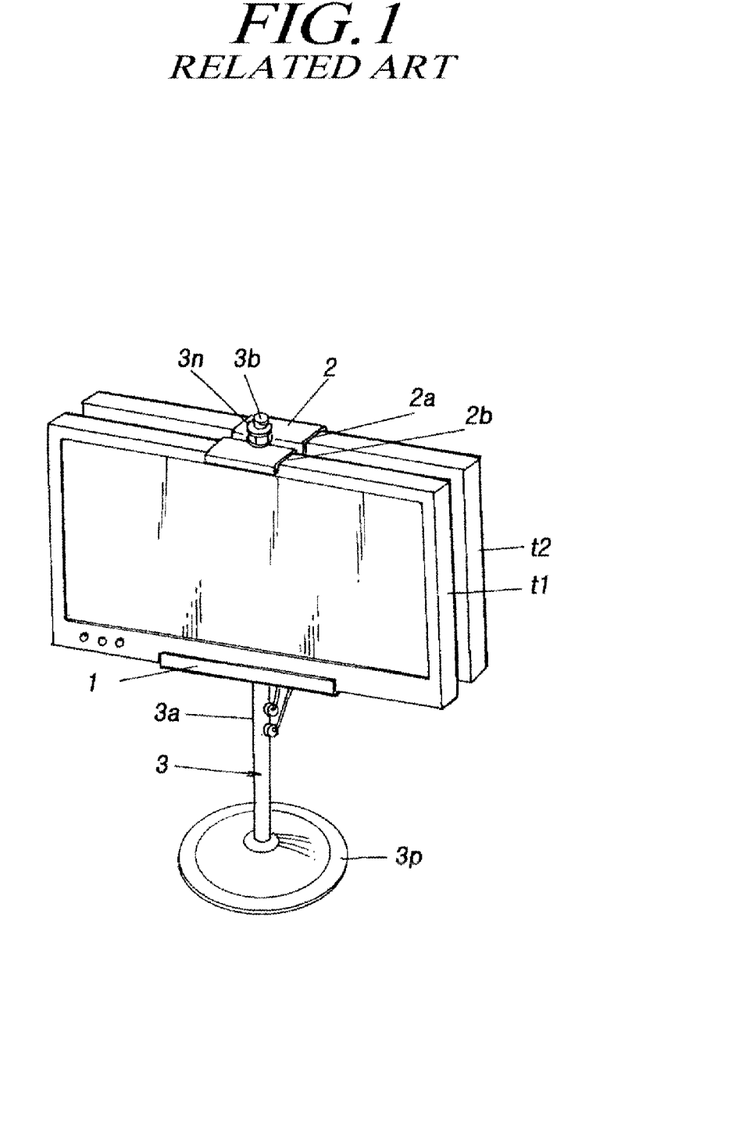
FIG. 1 is a perspective view illustrating a display device according to the related art.

FIG. 1 is a perspective view illustrating a display device according to the related art. In the display device, a support 1 in which two grooves are formed to support the lower ends of two display panels t1 and t2 in order to configure rear sides of two display panels leaning on each other are fixed in the middle portion of a prop 3a of a stand 3, and a fixing plate 2 in which two grooves 2a and 2b are formed to fix upper ends of the display panels is provided in order to be coupled with a screw bolt 3b of the prop 3a of the stand 3 and a screw nut 3n is screwed onto the screw bolt 3b perforating through a hole of the fixing plate 2. As a result, the prop 3a is coupled to a ball bearing mounted in the supporting plate 3p with a rotatable state.

However, in the display device according to the related art, there is a problem that the display device, of which two rear sides are leaning on each other and of which two front sides can be seen, has a bigger thickness, a lower visual appeal, and increased weight.

Further, as this display device is not rotatable, a user has to correct a position of the display device considering an angle of installation. Therefore, it is another problem that the display device has lower usability as well as limitation to a position of the user and a structure of an installation space or the like.

Particularly, in order to appeal to the users, requirements for a decrease in thickness or decrease in weight by minimizing the thickness of a display device and requirements for a design of decrease in thickness or decrease in weight to stimulate buying desire by making appeal to the sense of a beauty of the users are gradually increasing in recent.

Accordingly, in a display device, of which two rear sides are leaning on each other and of which two front sides can be seen, necessity for a display device, having decreased thickness and weight can be achieved and usability can be improved by considerably reducing the thickness of the display device, is increasing.

SUMMARY OF THE INVENTION

Problems to be Solved by the Invention

Considering this background, in small size or large size display devices, of which two rear sides lean on each other, and of which two front sides can be seen, an object of the present invention is to provide a display device in having decreased thickness and weight can be achieved by considerably reducing the thickness.

Another advantage of the present invention, in a small size or a large size display devices, of which two rear sides are leaning on each other and of which two front sides can be seen, is to provide a display device in which free rotation can be operated depending on a position of a user and a structure of an installation space and thus usability can be improved.

Further, advantages of the present invention are not limited thereto, and other advantages of the present invention that are not mentioned can be understood by those who skilled in the art from the following description.

Resolution for Solving the Problems

To accomplish the above-mentioned advantages, there is provided a display device that includes a middle cabinet in which two display panel of which two rear sides are leaning on each other are safely held and an incision is formed in at least a portion of a rim; a back cover which is interposed between the two display panels and has an extension portion that is inserted through the incision and extends to outside, and a fixing member in which control printed circuit boards that are coupled to the extension portion of the back cover and are connected to the two display panels respectively are embedded.

ADVANTAGES OF THE INVENTION

As described above, according to the present invention, in small size or large size display devices, of which two rear sides are leaning on each other and of which two front sides can be seen, decrease in thickness and decrease in weight can be achieved by considerably reducing the thickness.

Further, according to the present invention, in small size or large size display devices, of which two rear sides are leaning on each other and of which two front sides can be seen, free rotation is operated depending on a position of a user and a structure of an installation space and thus usability can be improved.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE ILLUSTRATED EMBODIMENTS

Embodiments of the present invention will be described in detail with reference to the accompanying drawings. In describing the invention with reference to the accompanying drawings, like elements are referenced by like reference numerals or signs regardless of the drawing numbers. When it is determined that detailed description of known techniques involved in the invention makes the gist of the invention obscure, the detailed description thereof will not be made.

Terms such as first, second, A, B, (a), and (b) can be used to describe elements of the invention. These terms are merely used to distinguish one element from another element and the essence, order, sequence, number, or the like of the elements is not limited to the terms. If it is mentioned that an element is "coupled" or "connected" to another element, it should be understood that the element is directly coupled or connected to another element or still another element is "interposed" therebetween or the elements may be "coupled" or "connected" to each other with still another element interposed therebetween.

Figure 2:
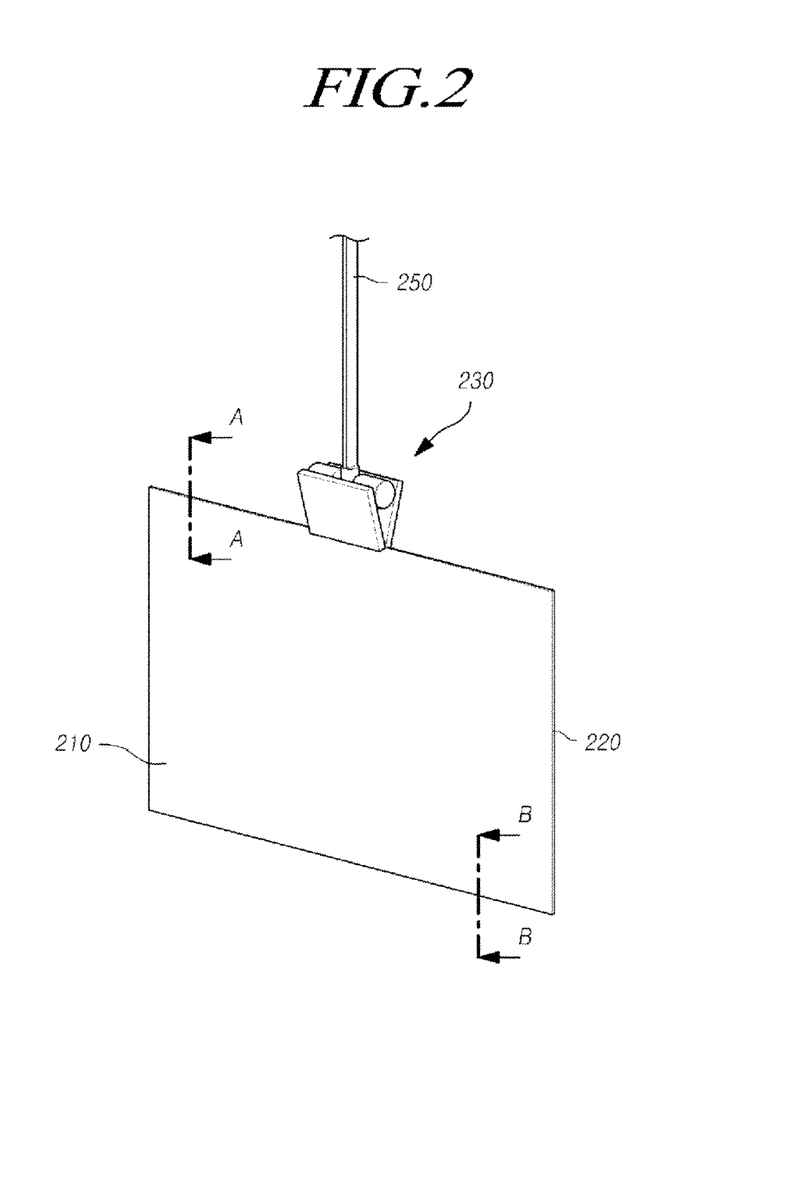
FIG. 2 is a perspective view illustrating a display device according to an embodiment of the present invention.
Figure 3:
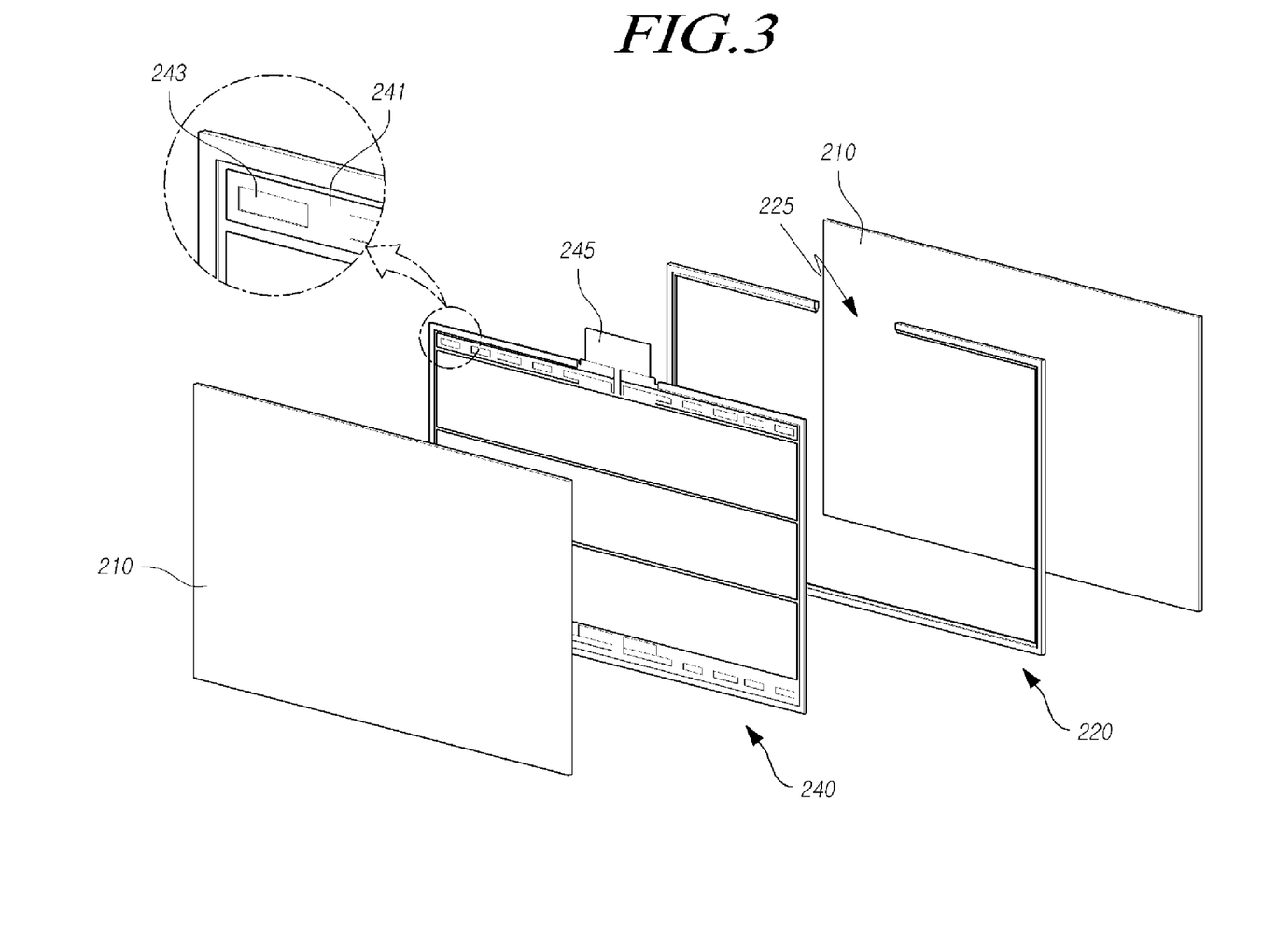
FIG. 3 is an exploded perspective view illustrating the display device according to an embodiment of the present invention.
Figure 4:
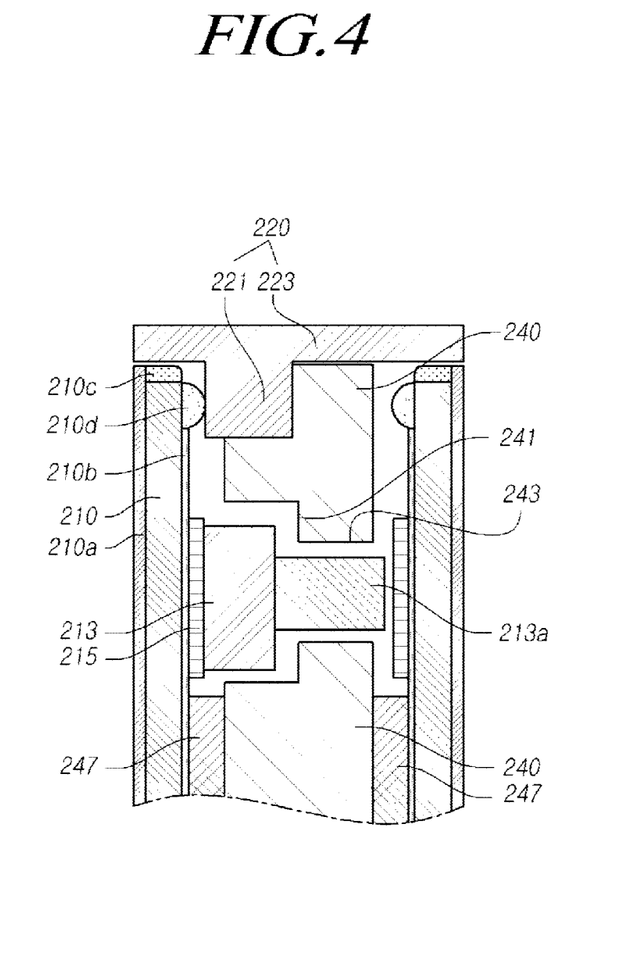
FIG. 4 is a cross-sectional view taken along the line A-A of FIG. 2.
Figure 5:
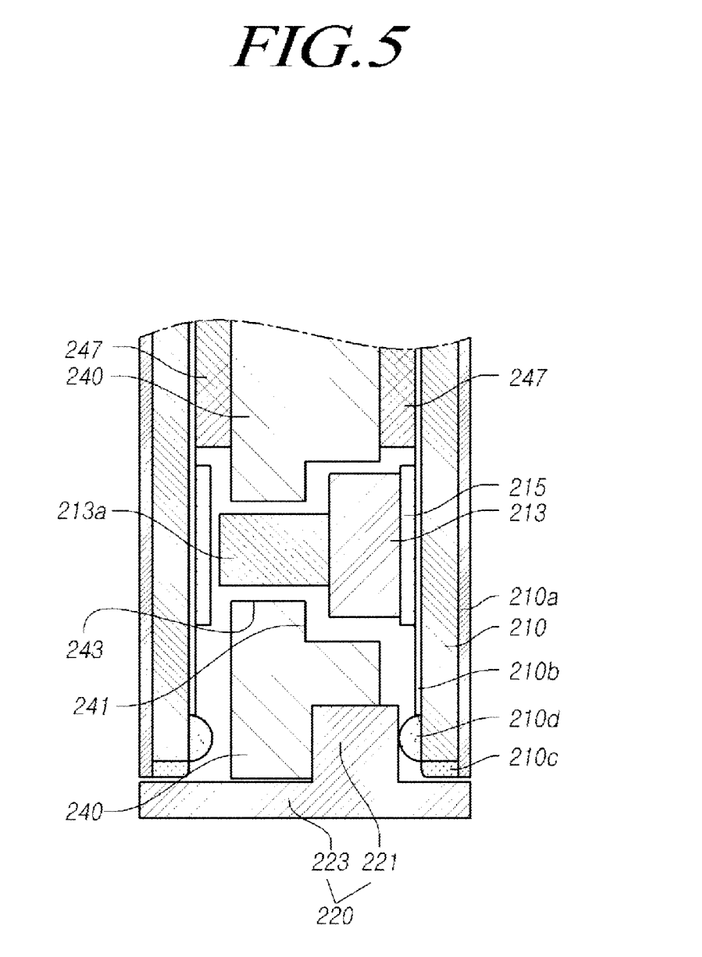
FIG. 5 is a cross-sectional view taken along the line B-B of FIG. 2.
Figure 6:
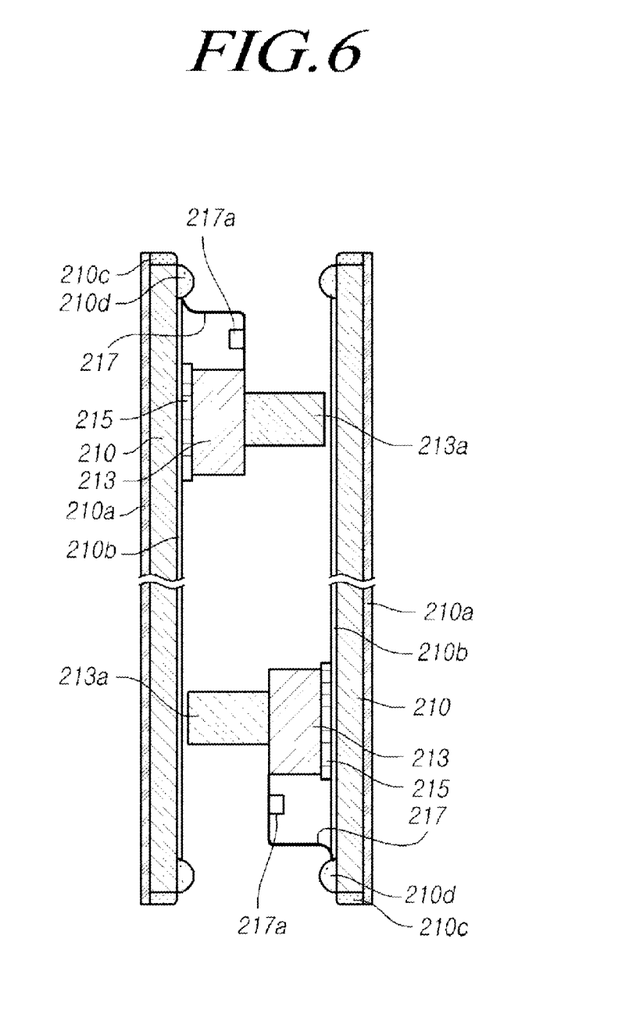
FIG. 6 is a cross-sectional view illustrating the display device according to the embodiment of the present invention.
Figure 7:
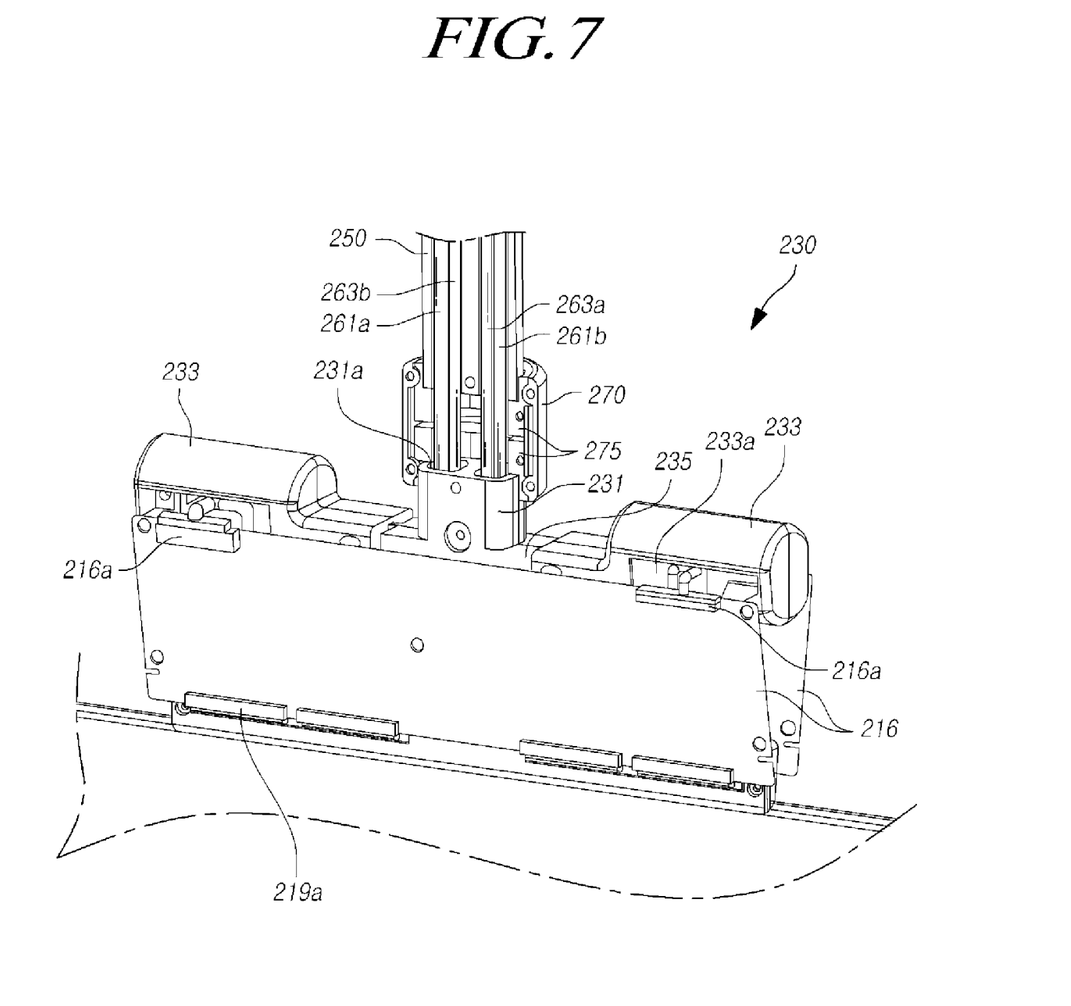
FIGS. 7 and 8 are perspective views illustrating the display device according to the embodiment of the present invention.
Figure 8:
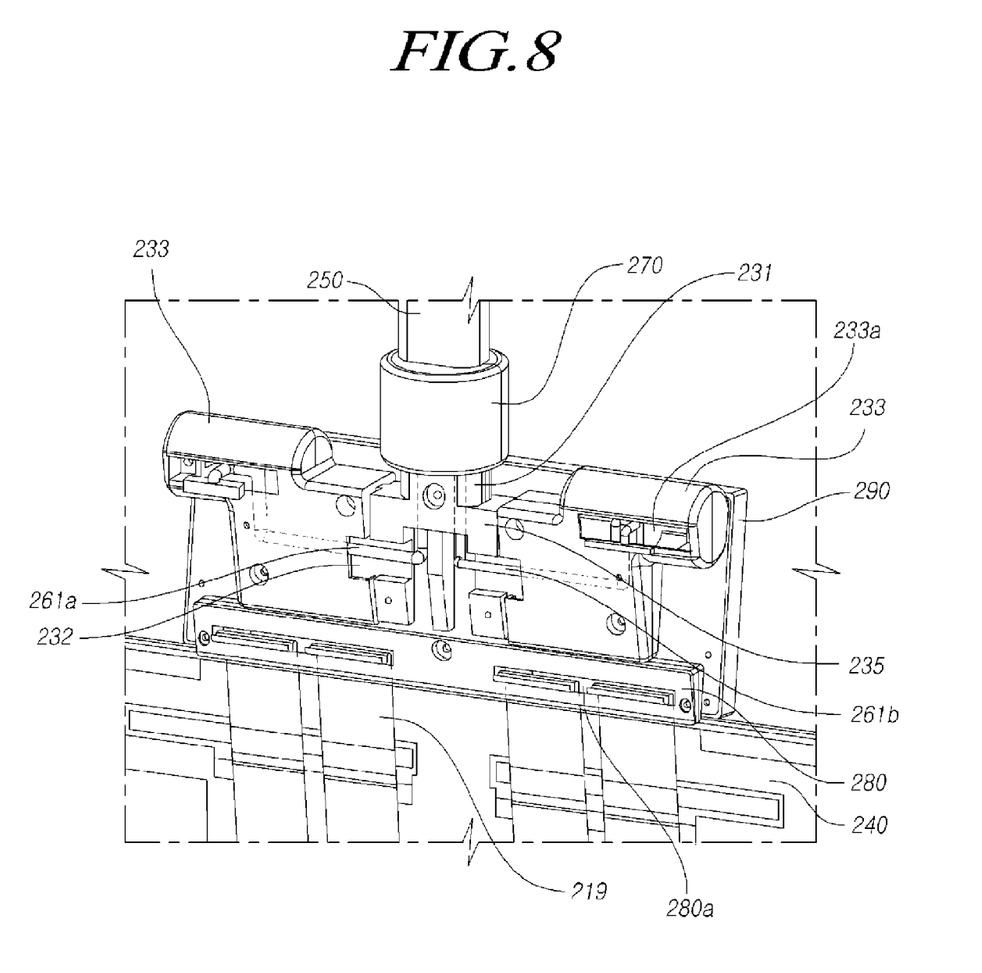
Figure 9:
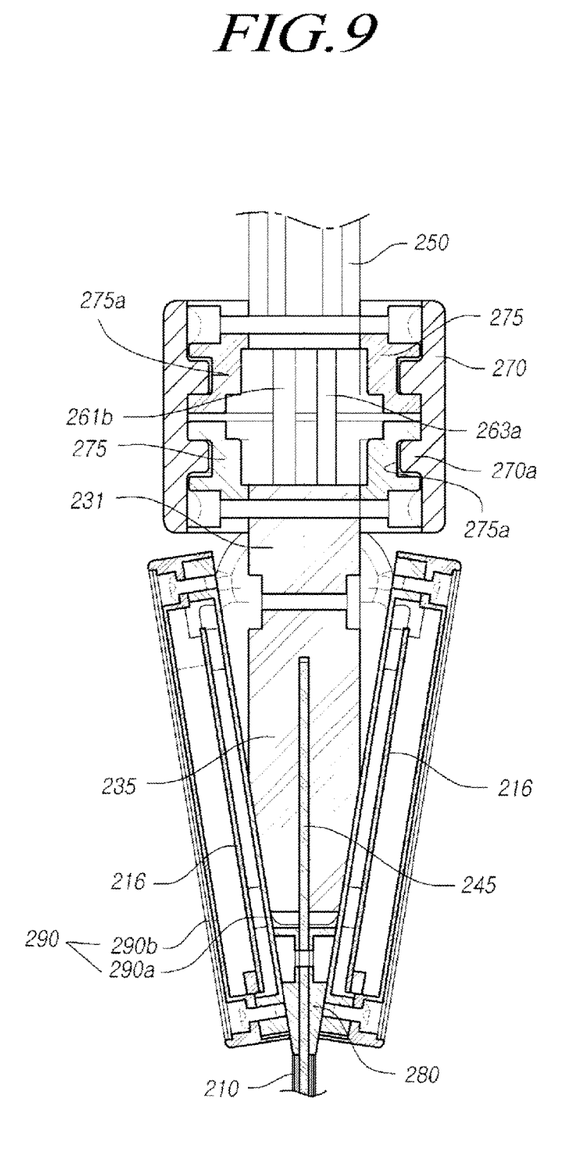
FIG. 9 is a cross-sectional view illustrating the display device according to the embodiment of the present invention.
Figure 10:
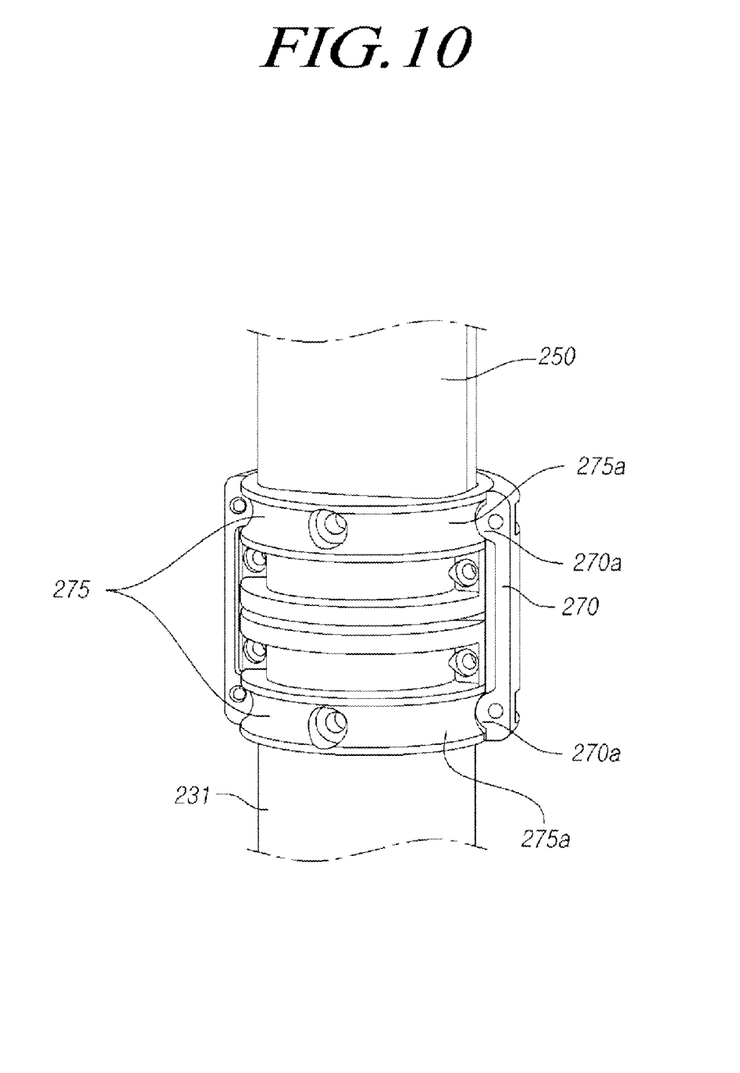
FIG. 10 is an exploded perspective view illustrating the display device according to the embodiment of the present invention.

FIG. 2 is a perspective view illustrating a display device according to an embodiment of the present invention, FIG. 3 is an exploded perspective view illustrating the display device according to the embodiment of the present invention, FIG. 4 is a cross-sectional view taken along the line A-A of FIG. 2, FIG. 5 is a cross-sectional view taken along the line B-B of FIG. 2, FIG. 6 is a cross-sectional view illustrating the display device according to the embodiment of the present invention, FIGS. 7 and 8 are perspective views illustrating the display device according to the embodiment of the present invention, FIG. 9 is a cross-sectional view illustrating the display device according to the embodiment of the present invention, and FIG. 10 is an exploded perspective view illustrating the display device according to the embodiment of the present invention.

As illustrated in the above-mentioned drawings, there is provided a display device according to the embodiment of the present invention, the display device including a middle cabinet 220 in which two display panels 210 of which two rear sides are leaning on each other are safely held and an incision 225 is formed in at least a portion of a rim; a back cover 240 which is interposed between the two display panels 210 and has an extension portion 245 that is inserted through the incision 225 and extends to outside, and a fixing member 230 which is embedded in a Control Printed Circuit Board (C-PCB) 216 that is coupled to the extension portion 245 of the back cover 240 and connected to the two display panels 210 respectively.

Further, the fixing member 230 includes power cables 261a and 263a and data cables 261b and 263b which are connected to the C-PCB 216 respectively, and are embedded therein and may further include a supporting member 250 through which the power cables 261a and 263a and the data cables 261b and 263b pass, of which one end is coupled to the fixing member 230 in a rotatable state, and of which the other end is coupled to a fixing body for fixing the display device.

First, a liquid crystal display panel or a light emitting display panel can be applied as the display panel 210 of the present invention without any limitation.

That is, when the display panel 210 is configured by the liquid crystal display panel, a backlight unit for illuminating a light to the liquid crystal display panel, a bottom polarizing plate attached to a lower substrate, and a top polarizing plate attached to the front of a top substrate may be further included. Further, depending on, for example, a Twisted Nematic (TN) mode, a Vertical Alignment (VA) mode, a In Plane Switching (IPS) mode, a Fringe Field Switching (FFS) mode, and the like, specific configurations of the bottom substrate and the top substrate is formed in various types known to the related art Further, when the display panel 210 is configured by the light emitting display panel, the light emitting display panel is configured by including a bottom substrate which includes plural light emitting cells, each cell being formed in an every area defined by a gate line, a data line, and a power (VDD) line, and a top substrate which is combined with the bottom substrate to face thereto.

Accordingly, each of the plural light emitting cells formed in the bottom substrate is configured by including at least one switching transistor coupled to the gate line and the data line, at least one driving transistor coupled to the switching transistor and the power (VDD) line, and a light emitting device (for example, OLED) emitting light depending on current controlled by switching of the driving transistor, and the top substrate is configured to include a hygroscopic agent for protecting a light emitting device from moisture or oxygen in the air.

Here, a light emitting device coupled to the driving transistor may be further included in the top substrate, and in this case, a light emitting device of the bottom substrate may be omitted.

While the display panels 210 are held in both sides of the middle cabinet 220 of the present invention, light emitting display panels 210 are illustrated as an example in drawings of the present invention. Considering a configuration of emitting a light by itself, the backlight unit for illuminating light to the panel is not included, and hereinafter, a description will be made to consider the light emitting display panel 210 as a reference.

Organic compound in a pixel array of the display panel 210 may be deteriorated when exposed to moisture or oxygen. In order to protect from such deterioration, encapsulation member 210b may be adhered to the rear surface of the display panel 210 to seal the pixel array.

Here, the encapsulation member 210b may be a metal plate or a glass plate, and a polarizing film 210a may be adhered to the entire surface of the display panel 210.

Further, in order to prevent light leakage caused by light emitted through sides from the pixel array, side seal member 210c may be provided on the sides of the display panel 210.

Here, the side seal member 210c is formed by polymer materials in which black pigment is added, and the side seal member 210c absorbs light emitted from the pixel array. Thus, light emitted through the sides of the display panel 210 cannot be seen.

In FIG. 6, plural flexible circuit films 217 in which an IC 217a is mounted are electrically connected to the display panel 210 in the rear surface of an end of the display panel 210 having a rectangular shape, and a source printed circuit board (S-PCB) 213 is provided in parallel to the display panel 210.

The plural flexible circuit films 217 are attached to a pad portion (not shown) and a S-PCB 213 by using a TAB (Tape Automated Bonding) process, and may be configured by a TCP (Tape Carrier Package) or a COF (Chip On Flexible board or Chip On Film).

Accordingly, the display panel 210 is electrically coupled or connected to the S-PCB 213 via the plural flexible circuit films 217, and the S-PCB 213 is electrically coupled to the plural flexible circuit films 217 to provide various signals for displaying an image to the display panel 210.

Meanwhile, in a side of the flexible circuit film 217, a moisture-proof and insulation member 210d (also known as Tuffy) is provided to protect an IC and circuit elements of the flexible circuit film 217.

In the present invention described above, and in FIGS. 4 and 5 the middle cabinet 220 includes a first supporting portion 223 surrounding sides of the display panel 210 and a second supporting portion 221 protruding from an inner side surface of the first supporting portion 223 to inside to safely hold the display panel 210.

The first supporting portion 223 surrounds sides of the display panel 210, and the display panel 210 is safely held on the front surface of the second supporting portion 221 and the back cover 240 is coupled to the rear surface of the second supporting portion 221.

When considering molding property, cost, and the like, the middle cabinet 220 is formed by using synthetic resins such as plastics or metallic materials, but when considering a reasonable intensity and heat dissipation property, the middle cabinet 220 is formed by using aluminum, aluminum alloy, stainless, stainless steel, zinc galvanizing steel plate, or the like.

Accordingly, display panel 210 is safely held on each front surface of the second supporting portion 221, and the second supporting portion 221 is supported by the back cover 240. Further, rear surface of the display panel 210 is joined to the back cover 240 with an adhesive member 247 such as a magnet or a double side tape and the like.

Further, in FIG. 3, the incision 225 is formed in at least a portion of the rim of the middle cabinet 220, and the back cover 240 of which both sides are coupled to rear sides of the display panel 210 respectively includes the extension portion 245 protruding through the incision 225 to the outside.

The C-PCB 216 which is coupled to the S-PCB 213 of the display panel 210 is provided in the extension portion 245 of the back cover 240, and the extension portion 245 is combined with the fixing member 230 and the supporting member 250 in the outer area of the display panel 210 and the middle cabinet 220. As a result, the thickness of the display device can be considerably reduced.

Further, in order to reduce the thickness of the display panel to be much slimmer, as illustrated in FIGS. 3 and 4, a holding groove 241 in which the S-PCB 213 of any one of the display panels 210 is safely held is formed in the upper part of the back cover 240, a perforation hole 243 through which circuit elements 213a protruding from the S-PCB 213 pass is formed in the holding groove 241, and an insulator 215 is provided between the S-PCB 213 and the encapsulation member 210b.

As illustrated in FIG. 5, a holding groove 241 in which the S-PCB 213 of the other of the display panels 210 is safely held is formed in the lower part of the back cover 240 and a perforation hole 243 through which circuit elements 213a protruding from the S-PCB 213 pass is formed in the holding groove 241.

As illustrated in FIG. 6, the S-PCB 213 and circuit elements 213a such as a resistor, condenser, or cable connector which are mounted in the S-PCB 213 and protrude from the S-PCB 213 are provided in the rear surface of the display panel 210 are arranged inside of the display device in top and down directions corresponding to each other, and as illustrated in FIGS. 4 and 5, the S-PCB 213 is held in the holding groove 241 of the back cover 240 and the circuit elements 213a is arranged in the perforation hole 243. Thus, the stack thickness of the display panels 210 which are leaning on each other and safely held in the middle cabinet 220 can be minimized.

This display device, in which the display panels 210 are leaning on each other and safely held in the middle cabinet 220 and the back cover 240, is fixed to a fixing body such as a ceiling or other structure via the fixing member 230 and the supporting member 250. Thus, a user can see both panels of the display device.

In the fixing member 230 which is coupled to the extension portion 245 of the back cover 240, the C-PCB 216 which are connected to the display panels 210 respectively are built, and the power cables 261a and 263a and the data cables 261b and 263b which are connected to the C-PCB 216 respectively are built.

Further, the power cables 261a and 263a and the data cables 261b and 263b which are connected to an external TV set-top box pass through the supporting member 250 which is joined to the top of the fixing member 230, and one end of the supporting member 250 is coupled to the fixing member 230 in a rotatable state, and the other end of the supporting member 250 is fixed to the fixing body such as a ceiling or other structure for fixing the display device. As a result, the display device can be seen depending on the position of a user by rotating the device.

That is, the supporting member 250 fixes the display device to an external fixing body, and connects the power cables 261a and 263a and the data cables 261b and 263b, which are connected from the external TV set-top box, to the display device.

Here, two pairs of the power cables 261a and 263a and the data cables 261b and 263b are arranged to both sides of the display panels 210 respectively to connect to a connector of the C-PCB 216, as illustrated in FIGS. 7 and 8, a first pair of a first power cable 261a and a first data cable 261b is arranged to one display panel 210, and a second pair of a second power cable 263a and a second data cable 263b is arranged to the other display panel 210.

Here, in the fixing member 230 coupled to the supporting member 250, a connecting portion 231 having an insertion hole 231a in which the power cables 261a and 263a and the data cables 261b and 263b are inserted, and a cable groove 232 which is related to the insertion hole 231a and in which the first pair of 261a and 261b and the second pair of 263a and 263b are arranged in both sides the extension portion 245 respectively to couple to the C-PCB 216.

Therefore, when the power cables 261a and 263a and the data cables 261b and 263b which are supplied from the external TV set-top box are coupled to each C-PCB 216 via the supporting member 250, coupling error or coupling confusion of an operator are prevented and coupling length or arrangement are optimized, and thus interference of electromagnetic wave generating from the cable can be minimized and cost for materials can be minimized.

The fixing member 230 is configured to include a fixing bracket 235 which is coupled to the extension portion 245 of the back cover 240 and in which a connecting portion 231 and a cable groove 232 are provided, and a cable bracket 233 which is coupled to both external sides of the fixing bracket 235 and in which a supporting hole 233a through which the power cables 261a and 263a and the data cables 261b and 263b is passed to the C-PCB 216 is provided.

That is, the power cables 261a and 263a and the data cables 261b and 263b passing through the cable groove 232 is configured to pass inside the fixing bracket 235 and the cable bracket 233 without direct touch with the C-PCB 216, so that damage of a timing controller (T-CON) or a power management IC (PMIC) and the like mounted in the C-PCB 216 can be prevented, interference of electromagnetic wave generating from the cable can be minimized, and the power cables 261a and 263a and the data cables 261b and 263b can be directly connected to the connector 219a of the C-PCB 216 by forming the supporting hole 233a in a position corresponding to the position of the connector of the C-PCB 216.

The fixing member 230 further includes a panel connecting bracket 280 which is coupled to both sides of the back cover 240 between the display panel 210 and the fixing bracket 235, and includes a perforation hole 280a which a flexible cable for connecting the S-PCB 213 of the display panel 210 to the C-PCB 216 pass through.

Here, the flexible cable 219 electrically connects the S-PCB 213 to the C-PCB 216, and may use any one of a flexible flat cable (FFC) and a flexible printed circuit (FPC).

Because of the panel connecting bracket 280, exposure of the flexible cable 219 which is arranged between the display panels 210 in the direction of the C-PCB 216 can be prevented, and thus sense of external beauty can be improved and damage of the flexible cable 219 can be prevented.

Further, the fixing member 230 further includes a cover 290 which surrounds the C-PCB 216 and is coupled to the outer sides of the cable bracket 233 and the panel connecting bracket 280 in order to prevent and protect exposure of the display panel 210 and the C-PCB 216.

Here, the cover 290 is configured by joining an inner cover 290a which is coupled to the outer sides of the cable bracket 233 and the panel connecting bracket 280 to form C-PCB 216 in a built-in type to an outer cover 290b which is joined to the inner cover 290a in the outer side of the C-PCB 216 by using a joining member.

Further, in order to couple the fixing member 230 to the supporting member 250 in a rotatable state, cylindrical-type inner guiding members 275 having guiding grooves 275a which are formed in the circumference surface are connected to one end of the supporting member 250 and one end of the connecting portion 231 respectively, and an outer guiding member 270 having protrusion 270a that are inserted into the guiding groove 275 are formed is coupled to the outer side of the inner guiding member 275, and thus the display device can be rotated.

Therefore, when the supporting member 250 is fixed to the fixing body such as a ceiling, a wall, other structure to support the display device, the display device can be rotated depending on the position of a user by rotating the outer guiding member 270.

As described above, according to the present invention, in a small size or a large size display devices, of which two rear sides are leaning on each other and of which two front sides can be seen, decrease in thickness and decrease in weight can be contrived by considerably reducing the thickness.

Further, according to the present invention, in a small size or a large size display devices, of which two rear sides are leaning on each other and of which two front sides can be seen, freely rotation is operated depending on a position of a user and a structure of an installation space and thus usability can be improved.

Foregoing embodiments disclosed herein shall be interpreted as only illustrative of the technical spirit of the present invention, and, those skilled in the art can understand that various variations and modifications can be implemented without departing from essential features of the present invention. Accordingly, it should be understood that embodiments disclosed in the present invention are not definitive but explanatory and the technical concepts of the present invention is not limited to the embodiments. The protective scope of the present invention is defined by the appended claims, and all the technical ideas within a range equivalent thereto should be construed as belonging to the scope of the present invention.

What is claimed is:

1. A display device comprising:
   a middle cabinet in which a first and a second display panel of which two rear sides are leaning on each other are safely held and an incision is formed in at least a portion of a rim of the middle cabinet;
   a back cover interposed between the first and the second display panels and having an extension portion inserted through the incision and extending to outside; and
   a fixing member in which a first and a second control printed circuit boards that are coupled to the extension portion of the back cover and are connected to the first and the second display panels respectively are embedded.

2. The display device according to claim 1, wherein a first power cable and a first data cable which are connected to the first control printed circuit board and a second power cable and a second data cable which are connected to the second control printed circuit board, the first power cable, the first data cable, the second power cable, and the second data cable being embedded in the fixing member.

3. The display device according to claim 2, further comprising:
   a supporting member through which the first and the second power cables and the first and the second data cables pass, of which one end is coupled to the fixing member in a rotatable state, and of which the other end is coupled to a fixing body for fixing the display device.

4. The display device according to claim 1, wherein a first holding groove, in which a first source printed circuit board of the first display panel is safely held, is formed in the upper part of the back cover, and a first perforation hole, through which first circuit elements protruding from the first source printed circuit board pass, is formed in the first holding groove.

5. The display device according to claim 4, wherein a second holding groove, in which a second source printed circuit board of the second display panels is safely held, is formed in a lower part of the back cover, and a second perforation hole, through which second circuit elements protruding from the second source printed circuit board pass, is formed in the second holding groove.

6. The display device according to claim 3, wherein the fixing member is coupled to the supporting member, includes a connecting portion having insertion holes in which a first pair of the first power cable and the first data cable and a second pair of the second power cable and the second data cable are inserted, and includes cable grooves which are coupled to the insertion holes respectively and through which the first pair arranged in one side the extension portion is couple to the first control printed circuit board and the second pair arranged in the other side the extension portion is couple to the second control printed circuit board.

7. The display device according to claim 6, wherein the fixing member includes:
a fixing bracket which is coupled to the extension portion of the back cover and in which a connecting portion and a cable groove are provided; and
a cable bracket which is coupled to both external sides of the fixing bracket and in which a supporting hole through which the first and the second power cables and the first and the second data cables are passed in the direction of the control printed circuit boards is provided.

8. The display device according to claim 7, wherein
the fixing member further includes a panel connecting bracket which is coupled to both sides of the back cover between the display panels and the fixing bracket and has perforation holes through which flexible cables for connecting the source printed circuit boards of the display panels to the control printed circuit board are passed.

9. The display device according to claim 8, wherein
the fixing member further includes a cover which surrounds the control printed circuit boards and is coupled to outer sides of the cable bracket and the panel connecting bracket.

10. The display device according to claim 6, wherein
plural cylindrical-type inner guiding members, which have guiding grooves formed in the circumference surface, are connected to one end of the supporting member and one end of the connecting portion respectively, and an outer guiding member, which has protrusions to be inserted into the guiding grooves, is coupled to the outer sides of the inner guiding members.

* * * * *